(12) United States Patent
Hung et al.

(10) Patent No.: US 10,600,759 B2
(45) Date of Patent: Mar. 24, 2020

(54) POWER AND GROUND DESIGN FOR THROUGH-SILICON VIA STRUCTURE

(71) Applicant: Advanced Semiconductor Engineering, Inc., Kaohsiung (TW)

(72) Inventors: Chih-Pin Hung, Kaohsiung (TW); Ying-Te Ou, Kaohsiung (TW); Pao-Nan Lee, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 15/404,093

(22) Filed: Jan. 11, 2017

(65) Prior Publication Data

US 2017/0200702 A1     Jul. 13, 2017

Related U.S. Application Data

(60) Provisional application No. 62/277,776, filed on Jan. 12, 2016, provisional application No. 62/279,263, filed on Jan. 15, 2016.

(51) Int. Cl.
*H01L 25/065* (2006.01)
*H01L 23/522* (2006.01)
(Continued)

(52) U.S. Cl.
CPC ........ *H01L 25/0657* (2013.01); *H01L 23/528* (2013.01); *H01L 23/5226* (2013.01);
(Continued)

(58) Field of Classification Search
CPC ............ H01L 21/76898; H01L 23/481; H01L 2224/023; H01L 2224/024; H01L 2225/06541
See application file for complete search history.

(56) References Cited

U.S. PATENT DOCUMENTS 7,446,424 B2    11/2008  Lu et al.
8,829,676 B2    9/2014   Yu et al.
(Continued)

FOREIGN PATENT DOCUMENTS

CN    103915374 A    7/2014
CN    104008981 A    8/2014
CN    104051383 A    9/2014

OTHER PUBLICATIONS

Non-Final Office Action for corresponding U.S. Appl. No. 15/479,074, dated Aug. 8, 2017, 14 pages.
(Continued)

*Primary Examiner* — Allen L Parker
*Assistant Examiner* — Gustavo G Ramallo
(74) *Attorney, Agent, or Firm* — Foley & Lardner LLP

(57) ABSTRACT

In one or more embodiments, a semiconductor device includes a substrate, a first dielectric layer and a first conductive layer. The substrate includes a first surface and a second surface opposite the first surface. The first dielectric layer is on the first surface of the substrate. The first conductive layer is on the first surface of the substrate and includes a first portion on the first dielectric layer and a second portion surrounded by the first dielectric layer. The second portion of the first conductive layer extends from the first portion of the first conductive layer through the first dielectric layer to contact the first surface of the substrate.

23 Claims, 17 Drawing Sheets

(51) Int. Cl.
  *H01L 23/528* (2006.01)
  *H01L 25/00* (2006.01)
  *H01L 23/31* (2006.01)

(52) U.S. Cl.
  CPC .......... *H01L 25/50* (2013.01); *H01L 23/3121* (2013.01); *H01L 2224/02371* (2013.01); *H01L 2224/02372* (2013.01); *H01L 2224/0401* (2013.01); *H01L 2224/04042* (2013.01); *H01L 2224/05569* (2013.01); *H01L 2224/05572* (2013.01); *H01L 2224/131* (2013.01); *H01L 2224/16145* (2013.01); *H01L 2224/16227* (2013.01); *H01L 2224/32145* (2013.01); *H01L 2224/32225* (2013.01); *H01L 2224/48091* (2013.01); *H01L 2224/48145* (2013.01); *H01L 2224/48227* (2013.01); *H01L 2224/73257* (2013.01); *H01L 2224/73265* (2013.01); *H01L 2225/06506* (2013.01); *H01L 2225/06513* (2013.01); *H01L 2225/06527* (2013.01); *H01L 2225/06544* (2013.01); *H01L 2924/10253* (2013.01); *H01L 2924/181* (2013.01)

(56) References Cited

U.S. PATENT DOCUMENTS

| | | | |
|---|---|---|---|
| 8,841,751 | B2 | 9/2014 | Wang et al. |
| 8,946,884 | B2 | 2/2015 | Kwon et al. |
| 9,000,586 | B2 | 4/2015 | Do et al. |
| 9,230,902 | B2 | 1/2016 | Yu et al. |
| 9,431,320 | B2 | 8/2016 | Carrillo-Ramirez |
| 2008/0006931 | A1* | 1/2008 | Oliver .................. H01L 21/561 257/712 |
| 2011/0026232 | A1* | 2/2011 | Lin .................. H01L 21/76898 361/760 |
| 2011/0169150 | A1* | 7/2011 | Su ....................... H01L 21/4857 257/675 |
| 2013/0187269 | A1 | 7/2013 | Lin et al. |
| 2013/0292808 | A1* | 11/2013 | Yen ....................... H01L 23/552 257/660 |
| 2014/0177189 | A1 | 6/2014 | Liu et al. |
| 2014/0191392 | A1 | 7/2014 | Tu et al. |
| 2014/0210080 | A1 | 7/2014 | Chang et al. |
| 2014/0242791 | A1 | 8/2014 | Yu et al. |
| 2016/0013124 | A1 | 1/2016 | Chen et al. |
| 2016/0155723 | A1 | 6/2016 | Lou |

OTHER PUBLICATIONS

Office Action from corresponding Chinese Patent Application No. 201710256395.5, dated Jun. 25, 2018, 5 pages.
Search Report from corresponding Chinese Patent Application No. 201710256395.5, dated Jun. 25, 2018, 3 pages.
Non-Final Office Action for U.S. Appl. No. 15/884,197, dated Mar. 8, 2019, 8 pages.
Notice of Allowance in U.S. Appl. No. 15/884,197, dated Aug. 22, 2019, 8 pages.

\* cited by examiner

POWER AND GROUND DESIGN FOR THROUGH-SILICON VIA STRUCTURE

CROSS-REFERENCE TO RELATED APPLICATIONS

This application claims the benefit of and priority to U.S. Provisional Application No. 62/277,776, filed 12 Jan. 2016, and U.S. Provisional Application No. 62/279,263, filed 15 Jan. 2016, the contents of which are incorporated herein by reference in their entireties

BACKGROUND

1. Technical Field

The present disclosure relates generally to a through-silicon via structure. More particularly, the present disclosure relates to power and ground design for a through-silicon via structure.

2. Description of the Related Art

Semiconductor device packaging has continued to receive a significant amount of attention from designers and manufacturers of electronic products. This attention is based upon the market demand for products with greater efficiency, higher performance, and smaller dimensions.

High power semiconductor devices present additional challenges in packaging since the resistance of the main current paths (including pads, contacts and traces) of the package should be carefully controlled in order to avoid reduction in efficiency or excessive heating. High power semiconductor devices may include devices such as field effect transistors (FETs), metal oxide semiconductor FETs (MOSFETs), insulated gate FETs (IGFETs), thyristors, bipolar transistors, diodes, MOS-controlled thyristors, and resistors. Further characteristics of high power semiconductor devices may include an ability to switch or conduct large currents, a vertical current flow from one side of the semiconductor device to the other side of the semiconductor device, and/or active pads or contacts on both the top and bottom surfaces of the semiconductor device.

SUMMARY

In one or more embodiments, a semiconductor device includes a substrate, a first dielectric layer and a first conductive layer. The substrate includes a first surface and a second surface opposite the first surface. The first dielectric layer is on the first surface of the substrate. The first conductive layer is on the first surface of the substrate and includes a first portion on the first dielectric layer and a second portion surrounded by the first dielectric layer. The second portion of the first conductive layer extends from the first portion of the first conductive layer through the first dielectric layer to contact the first surface of the substrate.

In one or more embodiments, a semiconductor package includes a first substrate, a semiconductor device and an encapsulation layer. The semiconductor device is on the first substrate and includes a second substrate, active circuitry and a first conductive layer. The second substrate includes a first surface and a second surface opposite the first surface. The active circuitry is on the first surface of the second substrate. The first conductive layer extends from the second surface of the second substrate toward the active circuitry and is electrically connected to the active circuitry. The first conductive layer also defines a space in the semiconductor device. The encapsulation layer is in the space defined in the semiconductor device.

In one or more embodiments, a semiconductor device includes a substrate, a first conductive layer and a second conductive layer. The substrate includes a first surface and a second surface opposite the first surface. The first conductive layer extends from the first surface of the substrate to the second surface of the substrate and is exposed from the second surface of the substrate. The second conductive layer is adjacent to the second surface of the substrate and contacts the exposed first conductive layer by the second surface of the substrate.

In one or more embodiments, a package-on-package structure includes a first semiconductor package structure, a second semiconductor device, a redistribution layer and a solder material. The second semiconductor device is disposed over the first semiconductor package structure. The second semiconductor device includes active circuitry disposed on a top surface of the second semiconductor device. The second semiconductor device further includes at least one via in electrically conductive contact with the active circuitry. The redistribution layer is disposed on a bottom surface of the second semiconductor device. The at least one via extends between the redistribution layer and the active circuitry. The solder material is disposed between the first semiconductor package structure and the redistribution layer. The solder material at least partially fills into a space in the at least one via.

BRIEF DESCRIPTION OF THE DRAWINGS

Common reference numerals are used throughout the drawings and the detailed description to indicate the same or similar elements. The present disclosure will be more apparent from the following detailed description taken in conjunction with the accompanying drawings.

DETAILED DESCRIPTION

For high power applications, a through-silicon via is often used to further improve performance of semiconductor devices. Through-silicon via etching is thus a part of the semiconductor device fabrication process. Long etching time is often used to etch through a silicon substrate. Moreover, to electrically connect the through-silicon via(s) to conductive layers in active circuitry in the semiconductor device, a portion of a dielectric layer at a bottom of the active circuitry may also be etched after the silicon substrate is etched through. However, a process for etching the silicon substrate and a process for etching a dielectric layer (e.g., silicon oxide) are different so that a wafer is moved from one chamber to another chamber. If a single chamber is used for both of the etchings, a chemical material and a gas for etching the silicon substrate in the chamber is removed before etching the dielectric layer. Therefore, etching the silicon substrate and the dielectric layer both may increase a cost of manufacturing the semiconductor device.

Figure 1:
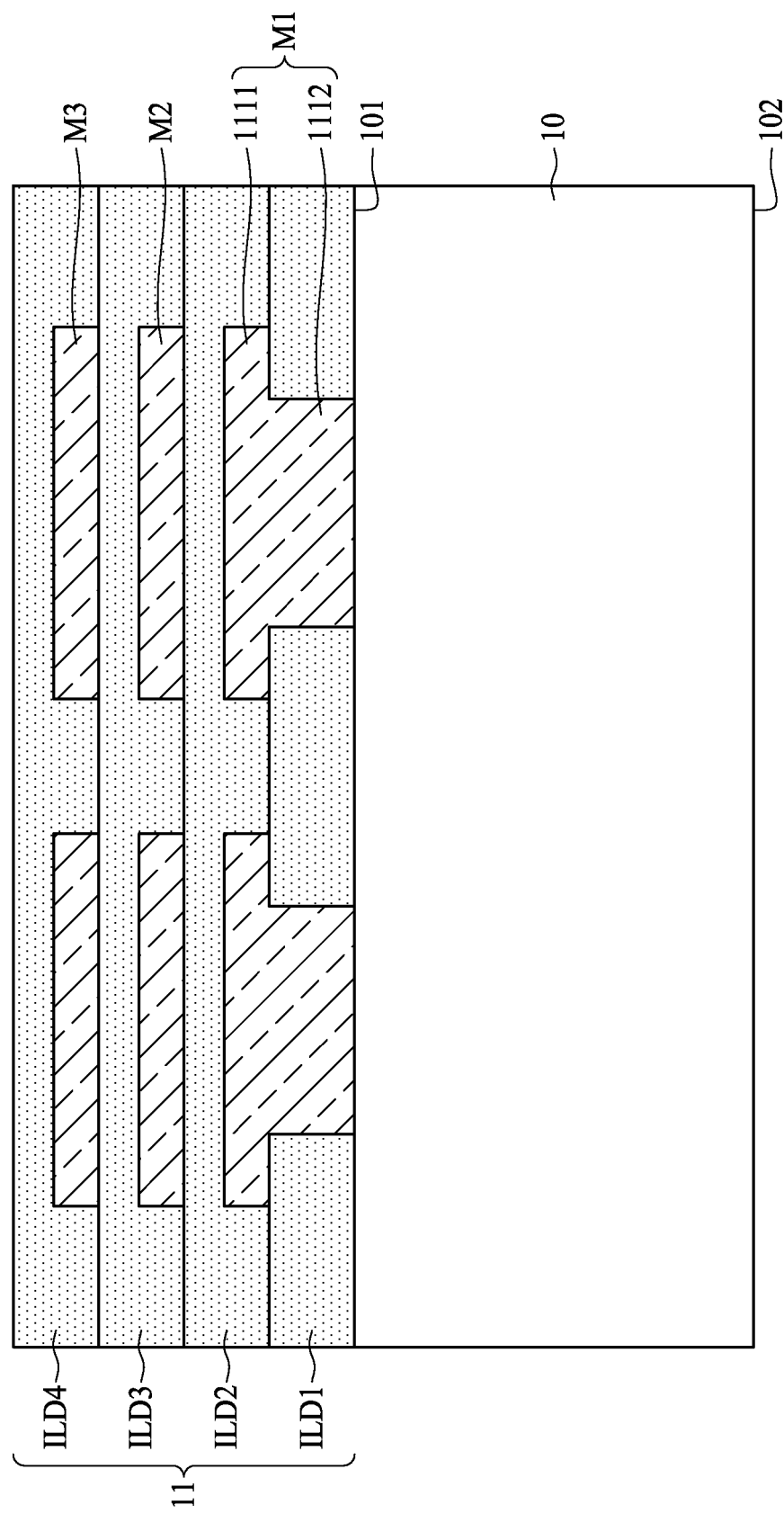
FIG. 1 illustrates a cross-sectional view of a semiconductor device in accordance with some embodiments of the present disclosure.

FIG. 1 illustrates a cross-sectional view of a semiconductor device in accordance with some embodiments of the present disclosure. The semiconductor device includes a substrate 10, a first dielectric layer ILD1 and a first conductive layer M1. The substrate 10 includes a first surface 101 and a second surface 102 opposite the first surface 101. The first dielectric layer ILD1 is on the first surface 101 of the substrate 10. The first conductive layer M1 is on the first surface 101 of the substrate 10 and includes a first portion 1111 on the first dielectric layer ILD1 and a second portion 1112 surrounded by the first dielectric layer ILD1. The second portion 1112 of the first conductive layer M1 extends from the first portion 1111 of the first conductive layer M1 through the first dielectric layer ILD1 to contact the first surface 101 of the substrate 10.

In some embodiments, the semiconductor device includes a substrate 10 (e.g., a semiconductor die) and active circuitry 11 disposed on the top surface 101 of the substrate. The active circuitry 11 includes stacked interlayer dielectrics (e.g., ILD1, ILD2, ILD3, ILD4), and metal interconnect layers (e.g., M1, M2, M3) integrated into the interlayer dielectrics in spaced relation to each other. The first conductive layer (e.g., metal layer) M1 of the metal interconnect layers includes the first portion 1111 that is a planar section, and the second portion 1112 that is a protruding section. The second portion 1112 extends from the first portion 1111 through the first dielectric layer ILD1 of the stacked interlayer dielectrics to the substrate 10 (e.g., silicon substrate). In some embodiments, the metal interconnect layers (e.g., M1, M2, M3) are formed by a thermal spraying technique in which melted (or heated) materials are sprayed onto a surface.

Figure 2:
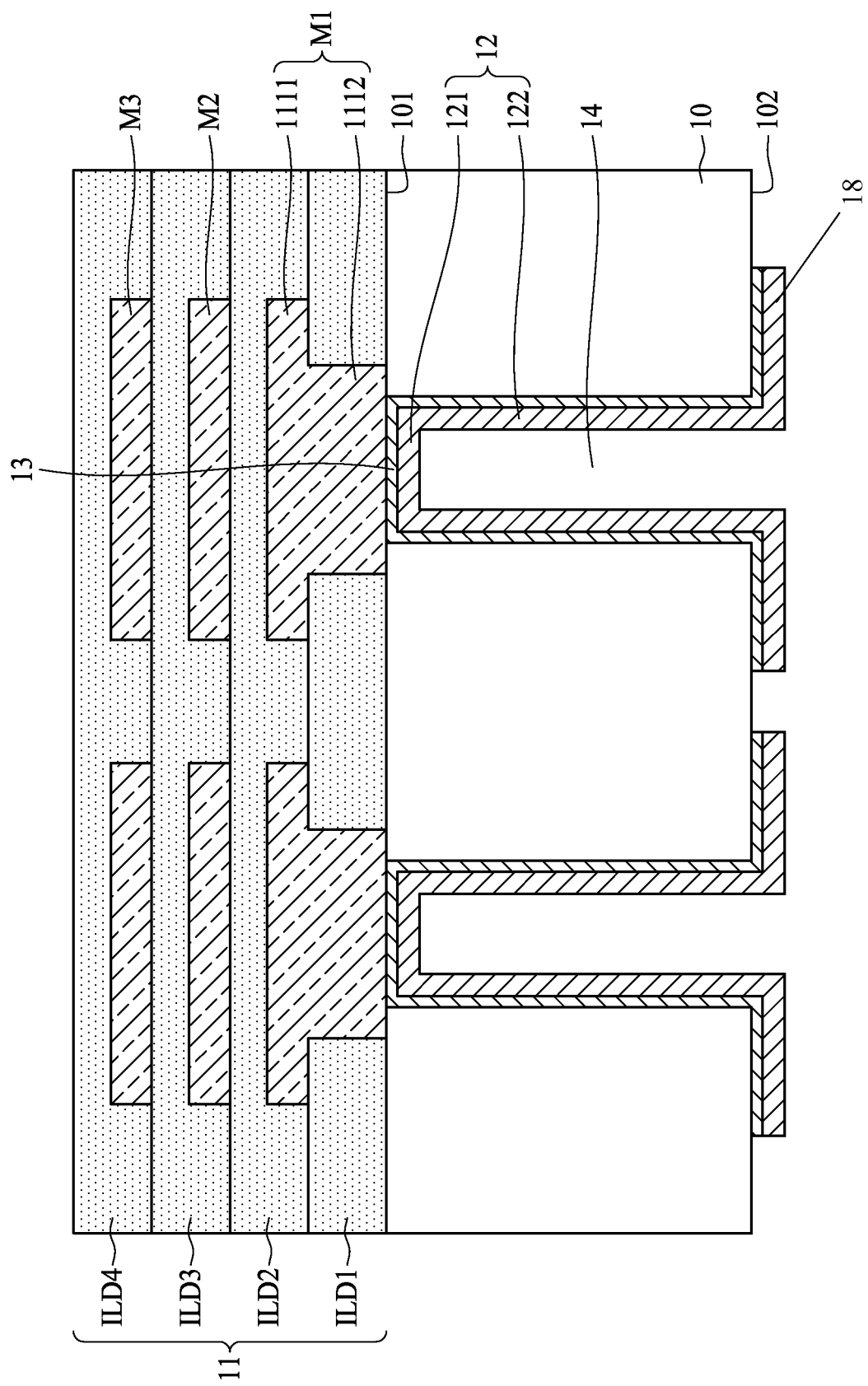
FIG. 2 illustrates a cross-sectional view of a semiconductor device in accordance with some embodiments of the present disclosure.

FIG. 2 illustrates a cross-sectional view of a semiconductor device in accordance with some embodiments of the present disclosure. Referring to FIG. 2, the semiconductor device is similar to the semiconductor device illustrated and described with reference to FIG. 1, except that the semiconductor device in FIG. 2 further includes a via hole 14 extending from the second surface 102 of the substrate 10 to the first surface 101 of the substrate 10. The semiconductor device in FIG. 2 also includes a second conductive layer 12 extending from the second surface 102 of the substrate 10 to the first surface 101 of the substrate 10 and electrically connected to the first conductive layer M1. In some embodiments, a seed layer 13 is between the second conductive layer 12 and the second portion 1112 of the first conductive layer M1. In some embodiments, the seed layer 13 contacts the second portion 1112 of the first conductive layer M1.

In some embodiments, the semiconductor device includes a silicon substrate (e.g., a semiconductor die) and active circuitry disposed on a top surface of the silicon substrate. The active circuitry includes stacked interlayer dielectrics (e.g., ILD1, ILD2, ILD3, ILD4), and metal interconnect layers (e.g., M1, M2, M3) integrated into the interlayer dielectrics in spaced relation to each other. The first conductive layer (e.g., metal layer) M1 of the metal interconnect layers includes the first portion 1111 that is a planar section, and the second portion 1112 that is a protruding section, similar to those shown in FIG. 1. In FIG. 2, in some embodiments, the second portion 1112 extends from the first portion 1111 through the first dielectric layer ILD1 of the stacked interlayer dielectrics to the substrate 10 (e.g., silicon substrate). The second conductive layer (e.g., conductive interconnection via) 12 extends vertically (in the orientation shown) through the substrate 10 from the bottom surface 102 of the substrate 10 to the top surface 101 of the substrate 10 (e.g., to the bottom surface of the second portion 1112 of the first conductive layer M1).

In some embodiments, the second conductive layer (e.g., interconnection via) 12 is generally cylindrical (e.g., including approximately a circular cross-sectional circumference). In other embodiments, the second conductive layer (e.g., interconnection via) 12 is in a shape other than a generally cylindrical shape, such as including approximately a square, rectangular, or elliptical cross-section circumference, or other shape. The second conductive layer (e.g., interconnection via) 12 includes a conductive upper portion 121 embedded in the top surface 101 of the substrate 10 and a conductive wall portion 122 physically and electrically connected to the conductive upper portion 121, where the conductive wall portion 122 defines the via hole (e.g., void) 14 at a core of the second conductive layer (e.g., interconnection via) 12 (e.g., the conductive wall portion 122 including an annular cross-section). In some embodiments (e.g., as shown in FIG. 2), the second conductive layer (e.g., interconnection via) 12 includes the top conductive portion 121 and the conductive wall portion 122, and the via hole (e.g., void) 14 defined by the conductive wall portion 122 is unfilled. A redistribution layer (RDL) 18 is disposed on a bottom surface of the substrate 10. In some embodiments, the RDL 18 and the conductive wall portion 122 of the second conductive layer (e.g., interconnection via) 12 are integrally formed, such as in a same process stage. In some embodiments, the RDL 18 and the second conductive layer (e.g., interconnection via) 12 are formed by electro plating to form a thin coherent metal coating.

Connection points may be defined by the RDL 18. The connection points provide for electrical connection between the active circuitry 11 disposed on the top surface 101 of the substrate 10, or circuitry in the substrate 10, to external components to be connected at a bottom side of the semiconductor device. In some embodiments, the connection points are ground connection points.

Figure 3:
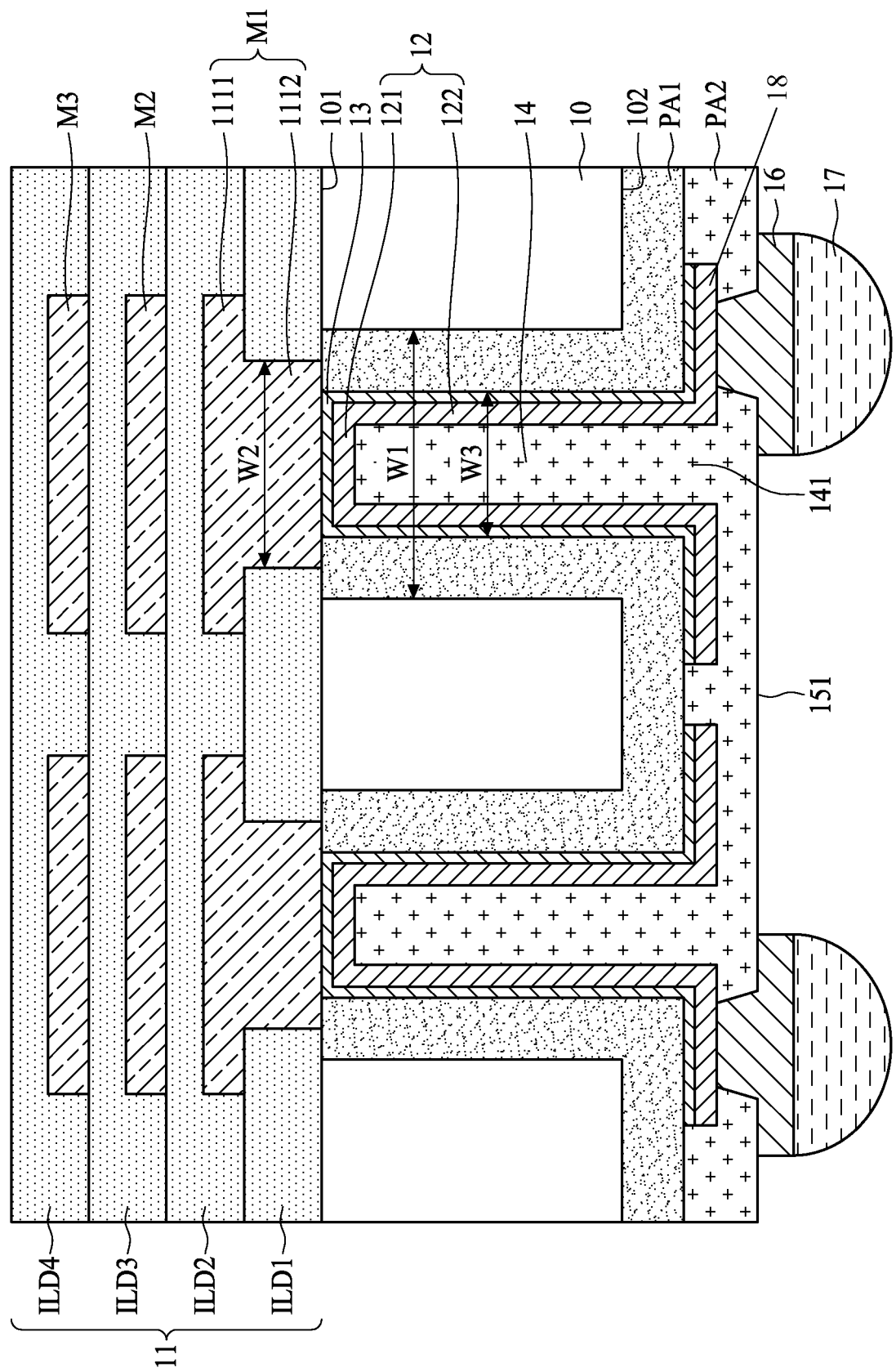
FIG. 3 illustrates a cross-sectional view of a semiconductor device in accordance with some embodiments of the present disclosure.

FIG. 3 illustrates a cross-sectional view of a semiconductor device in accordance with some embodiments of the present disclosure. Referring to FIG. 3, the semiconductor device is similar to the semiconductor device illustrated and described with reference to FIG. 2, except that the semiconductor device further includes a first passivation layer PA1 on the second surface 102 of the substrate 10. In some embodiments, the semiconductor device further includes a second passivation layer PA2 on the second conductive layer 12 and on the first passivation layer PA1. In some embodiments, the semiconductor device further includes a third conductive layer 16, e.g., Under Ball Metallurgy (UBM), on and electrically connected to the second conductive layer 12. In some embodiments, the semiconductor device further includes a solder ball 17. As shown in FIG. 3, a width W1 of the first passivation layer PA1 is greater than a width W2 of the second portion 1112 of the first conductive layer M1. In some embodiments, a width of the via hole 14 is greater than a width W2 of the second portion 1112 of the first conductive layer M1. In some embodiments, a width of the via hole 14 is less than a width W2 of the second portion 1112 of the first conductive layer M1. In some embodiments, a width of the via hole 14 is substantially the same as a width W2 of the second portion 1112 of the first conductive layer M1.

In some embodiments, the second conductive layer (e.g., interconnection via) 12 further includes an insulator portion 141 disposed in the via hole (e.g., void) 14 defined by the conductive wall portion 122. The second conductive layer (e.g., interconnection via) 12 further includes a passivation portion encircling a circumference of the conductive wall portion 122. In some embodiments (e.g., as shown in FIG. 3), the width W2 (e.g., an outer diameter) of a cross-section of the second portion 1112 of the first conductive layer (e.g., metal layer) M1 is greater than a width W3 (e.g., an outer diameter) of a cross-section of the conductive wall portion 122 and the seed layer 13 and is less than the width W2 (e.g., an outer diameter) of a cross-section of the second conductive layer (e.g., interconnection via) 12 (at an outer surface of the passivation portion). The passivation layer PA1 is disposed on the bottom surface 102 of the substrate 10. The passivation layer PA1 is coupled to the passivation portion of the second conductive layer (e.g., interconnection via) 12. In some embodiments, the passivation layer PA1 and the passivation portion of the second conductive layer (e.g., interconnection via) 12 are formed integrally, such as in a same process stage.

The RDL 18 is disposed on a bottom surface 151 of the second passivation layer PA2, and is electrically connected to the conductive wall portion 122 of the interconnection via 12. In some embodiments, the RDL 18 is integrally formed with the conductive wall portion 122, such as formed in a same process stage.

The second passivation layer (e.g., insulation layer) PA2 is disposed over the passivation layer PA1 and the RDL 18. The second passivation layer (e.g., insulation layer) PA2 contacts the insulator portion 141 in the via hole (e.g., void) 14 of the conductive wall portion 122 of the second conductive layer (e.g., interconnection via) 12. In some embodiments, the insulator portion 141 and the second passivation layer (e.g., insulation layer) PA2 are integrally formed, such as formed in a same process stage. The second passivation layer (e.g., insulation layer) PA2 defines openings.

The third conductive layer (e.g., UBM) 16 is disposed in the openings defined by the second passivation layer (e.g., insulation layer) PA2. The solder balls 17 are disposed on the third conductive layer 16. Connection points are defined by the solder balls 17. The connection points provide for electrical connection between the active circuitry 11 disposed on the top surface 101 of the substrate 10, or circuitry in the substrate 10, to external components to be connected at a bottom side of the semiconductor device. The connection points may be input or output connections ("signal I/O"), power or ground.

In some embodiments, the referencing and order of the conductive layers can be changed. In some embodiments, a semiconductor device comprises a substrate 10, a first conductive layer (or seed layer) 13 and a second conductive layer M1. The substrate 10 includes a first surface 101 and a second surface 102 opposite the first surface 101. The first conductive layer 13 extends from the first surface 101 of the substrate 10 to the second surface 102 of the substrate 10 and is exposed from the second surface 102 of the substrate 10. The second conductive layer M1 is adjacent to the second surface 102 of the substrate 10 and contacts the exposed first conductive layer 13 by the second surface 102 of the substrate 10. In some embodiments, the semiconductor device further includes a via hole 14 extending from the second surface 102 of the substrate 10 to the first surface 101 of the substrate 10. The semiconductor device also includes a third conductive layer 12 extending from the second surface 102 of the substrate 10 to the first surface 101 of the substrate 10 and electrically connected to the second conductive layer M1.

Figure 4:
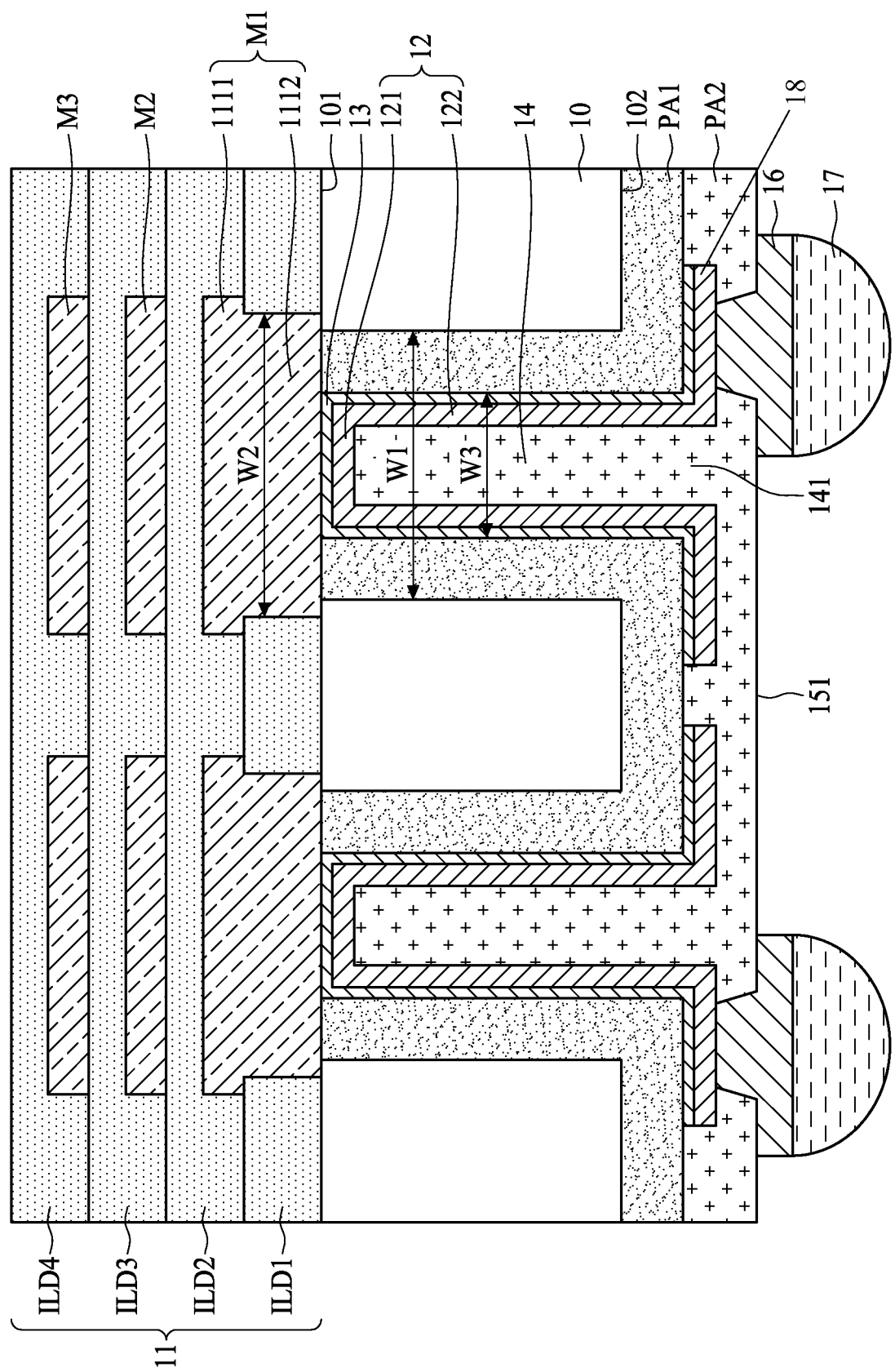
FIG. 4 illustrates a cross-sectional view of a semiconductor device in accordance with some embodiments of the present disclosure.

FIG. 4 illustrates a cross-sectional view of a semiconductor device in accordance with some embodiments of the present disclosure. Referring to FIG. 4, the semiconductor device is similar to the semiconductor device illustrated and described with reference to FIG. 3, except that a width W1 of the first passivation layer PA1 is smaller than a width W2 of the second portion 1112 of the first conductive layer M1.

In some embodiments, the semiconductor device of FIG. 4 is similar to the semiconductor device of FIG. 3, with a difference being that the width W2 (e.g., an outer diameter) of a cross-section of the second portion 1112 of the first conductive layer (e.g., metal layer) M1 is greater than the width W3 (e.g., an outer diameter) of a cross-section of the conductive wall portion 122 of the interconnection via 12 and the seed layer 13 and greater than the width W1 (e.g., an outer diameter) of a cross-section of the second conductive layer (e.g., interconnection via) 12 (at an outer surface of the passivation portion).

Figure 5:
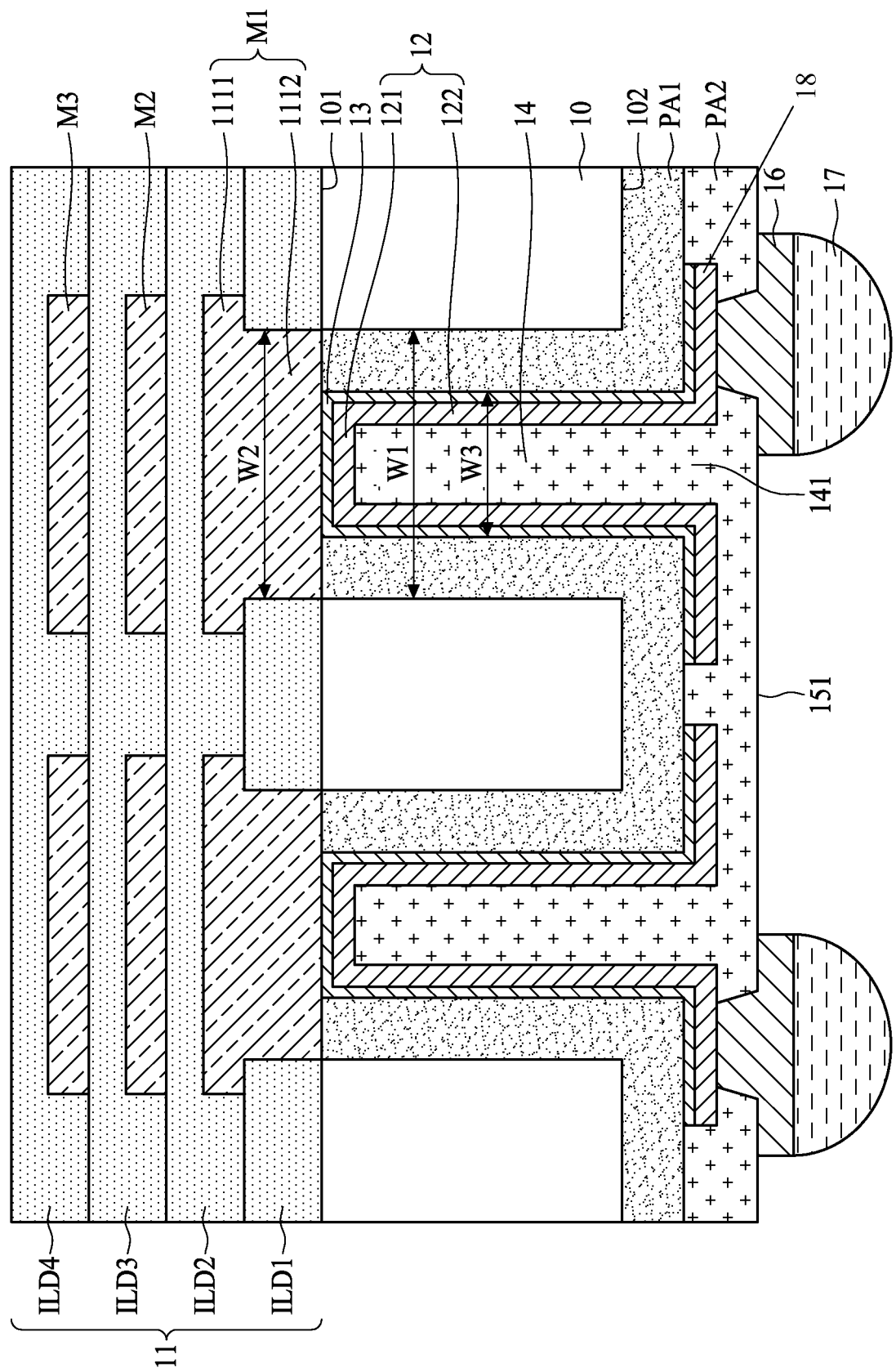
FIG. 5 illustrates a cross-sectional view of a semiconductor device in accordance with some embodiments of the present disclosure.

FIG. 5 illustrates a cross-sectional view of a semiconductor device in accordance with some embodiments of the present disclosure. Referring to FIG. 5, the semiconductor device is similar to the semiconductor device illustrated and described with reference to FIG. 3, except that a width W1 of the first passivation layer PA1 is the same as a width W2 of the second portion 1112 of the first conductive layer M1.

Figure 6:
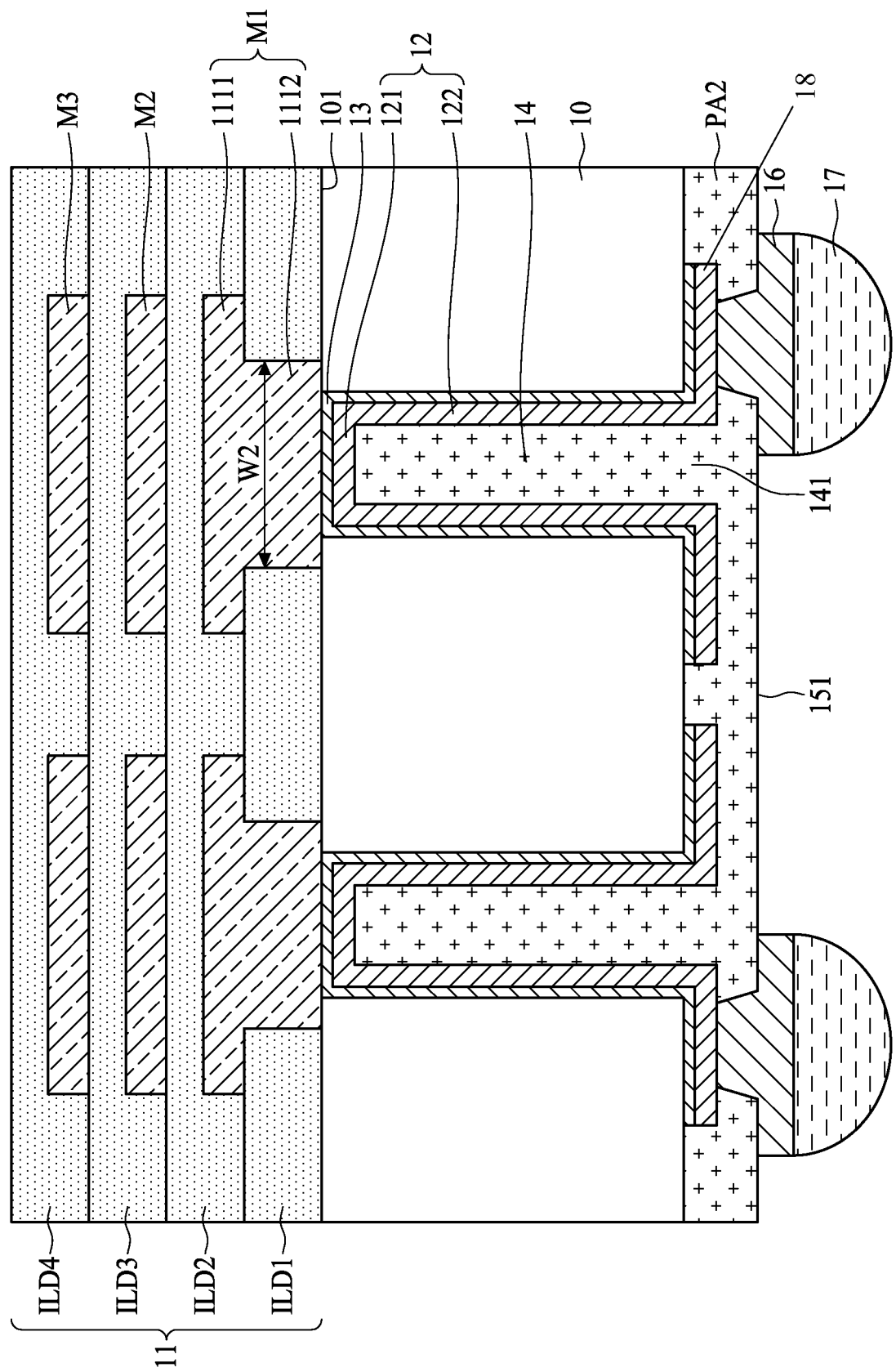
FIG. 6 illustrates a cross-sectional view of a semiconductor device in accordance with some embodiments of the present disclosure.

FIG. 6 illustrates a cross-sectional view of a semiconductor device package in accordance with some embodiments of the present disclosure. The semiconductor device of FIG. 6 is similar to the semiconductor device of FIG. 3, a difference being that the passivation portion of the second conductive layer (e.g., interconnection via) 12 and the first passivation layer PA1 as shown in FIG. 3 are omitted. In some embodiments (e.g., as shown in FIG. 6), the second conductive layer (e.g., interconnection via) 12 includes the conductive upper portion 121, the conductive wall portion 122, and the insulator portion 141 in the via hole (e.g., void) 14 defined by the conductive wall portion 122.

The RDL 18 is disposed on the bottom surface 102 of the substrate 10 and may be electrically connected to the conductive wall portion 122 of the second conductive layer (e.g., interconnection via) 12. In some embodiments, the RDL 18 and the conductive wall portion 122 of the second conductive layer (e.g., interconnection via) 12 are integrally formed, such as in a same process stage. The second passivation layer (e.g., insulation layer) PA2 may be disposed over the RDL 18. In some embodiments, the second passivation layer (e.g., insulation layer) PA2 and the insulator portion 141 of the second conductive layer (e.g., interconnection via) 12 are integrally formed, such as in a same process stage. The second passivation layer (e.g., insulation layer) PA2 defines openings.

The third conductive layer (e.g., UBM) 16 is disposed in the openings defined by the second passivation layer (e.g., insulation layer) PA2. Solder balls 17 are disposed on the third conductive layer 16. Connection points are defined by the solder balls 17. The connection points provide for electrical connection between the active circuitry 11 disposed on the top surface 101 of the substrate 10, or circuitry in the substrate 10, to external components to be connected at a bottom side of the semiconductor device. In some embodiments, the connection points are ground connection points.

Figure 7:
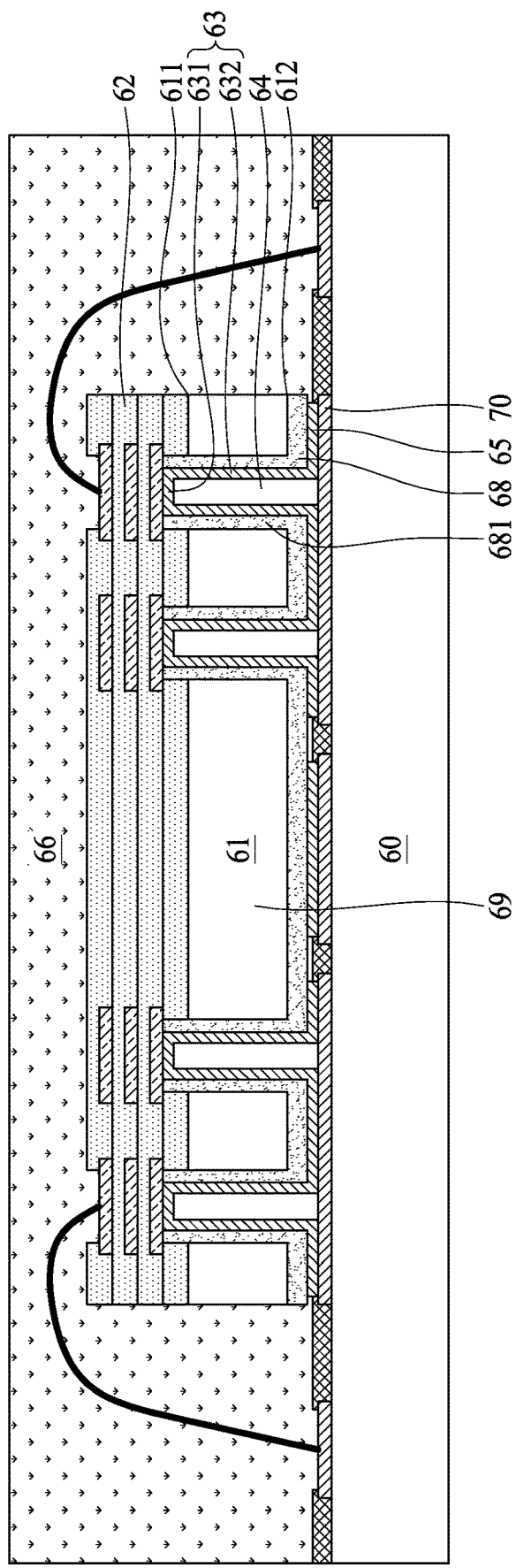
FIG. 7 illustrates a cross-sectional view of a semiconductor package in accordance with some embodiments of the present disclosure.

FIG. 7 illustrates a cross-sectional view of a semiconductor package in accordance with some embodiments of the present disclosure.

In one or more embodiments, a semiconductor device includes a silicon substrate and active circuitry. The silicon substrate includes opposed top and bottom surfaces. The active circuitry is disposed on the top surface of the silicon substrate. The active circuitry includes a plurality of stacked interlayer dielectrics and a plurality of metal interconnect layers integrated into the interlayer dielectrics in spaced relation to each other. A first metal layer of the metal interconnect layers includes two portions. A first portion of the two portions is a planar section and a second portion of the two portions is a protruding section. The protruding section extends from the first portion to the silicon substrate through a first dielectric layer of the stacked interlayer dielectrics.

In some embodiments, the semiconductor device further includes an interconnection via extending through the silicon substrate and in electrically conductive contact with the first metal layer. In some embodiments, the interconnection via includes a conductive upper portion and a conductive wall portion coupled to the conductive upper portion, and the conductive wall portion defines a void in the interconnection via. In some embodiments, the interconnection via further includes an insulator portion disposed in the void.

In some embodiments, the semiconductor device further includes a passivation layer disposed on a bottom surface of the silicon substrate and an RDL disposed on a bottom surface of the passivation layer. The RDL is electrically connected to the conductive wall portion of the interconnection via. In some embodiments, the RDL provides a ground connection point electrically coupled to the first metal layer through the interconnection via.

In some embodiments, the semiconductor device further includes the RDL disposed on the bottom surface of the silicon substrate, the RDL electrically connected to the conductive wall portion of the interconnection via. In some embodiments, the RDL provides a ground connection point electrically coupled to the first metal layer through the interconnection via.

FIG. 7 illustrates a cross-sectional view of a semiconductor package in accordance with some embodiments of the present disclosure. The semiconductor package includes a first substrate 60, a semiconductor device 69 and an encapsulation layer 66. The semiconductor device 69 is on the first substrate 60 and includes a second substrate 61, active circuitry 62 and a first conductive layer 63. The second substrate 61 includes a first surface 611 and a second surface 612 opposite the first surface 611. The active circuitry 62 is on the first surface 611 of the second substrate 61. The first conductive layer 63 extends from the second surface 612 of the second substrate 61 toward the active circuitry 62 and is electrically connected to the active circuitry 62. The first conductive layer 63 also defines a space 64 in the semiconductor device 69. The semiconductor package further includes a second conductive layer 70 electrically connected to the first conductive layer 63.

In some embodiments, the semiconductor package structure includes the first substrate 60 (e.g., an organic substrate, a wafer, or a semiconductor device 69 such as a semiconductor chip), the semiconductor device 69 disposed on the first substrate 60, and the encapsulation layer (e.g., encapsulant) 66 (e.g., a mold compound or underfill) over the first substrate 60 and encapsulating the semiconductor device 69.

The semiconductor package structure includes the active circuitry 62 disposed on the top surface of the semiconductor device 69. The active circuitry 62 includes the stacked interlayer dielectrics, and the metal interconnect layers integrated into the interlayer dielectrics in spaced relation to each other.

In some embodiments, a passivation layer 68 is disposed on a bottom surface of the semiconductor device 69.

An RDL 65 is disposed on a bottom surface of the passivation layer 68, or on the bottom surface of the semiconductor device 69 if the passivation layer 68 is omitted.

Pads, such as input/output (I/O) signal pads, ground pads, or power pads, are disposed on an upper surface of the first substrate 60. A solder mask is disposed on the upper surface of the substrate and exposes the pads on the upper surface of the first substrate 60. Connection pads defined by the active circuitry 62 may be electrically connected to the pads on the upper surface of the first substrate 60 through bond wires. The semiconductor device 69 may be connected to the pads on the upper surface of the first substrate 60, such as by flip-chip bonding.

Figure 8:
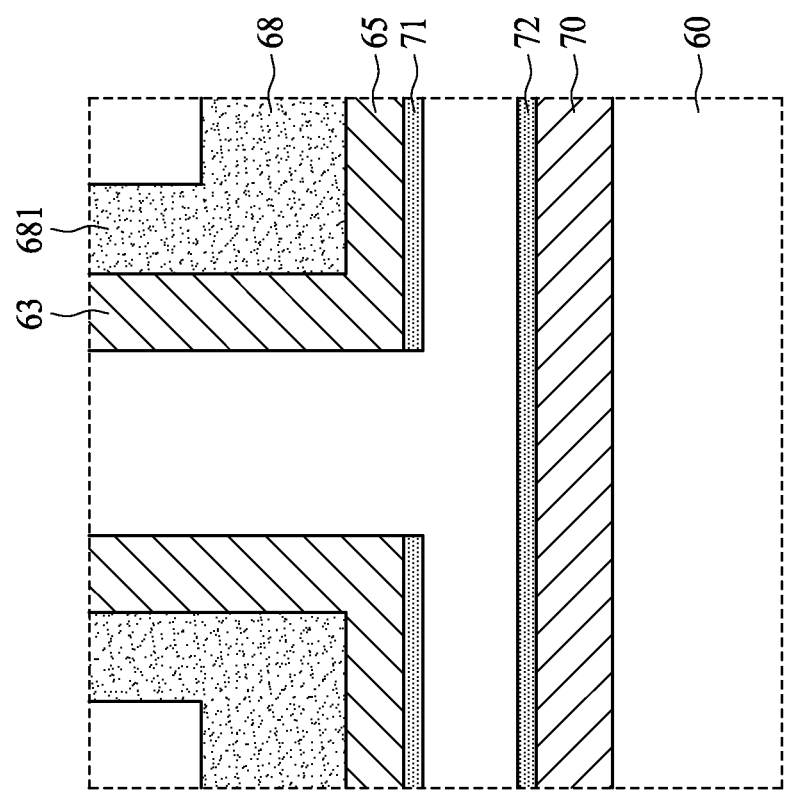
FIG. 8 illustrates an enlarged view of a portion of the semiconductor package shown in FIG. 7 during manufacturing of the semiconductor package in accordance with some embodiments of the present disclosure.

FIG. 8 illustrates an enlarged view of a portion of the semiconductor package shown in FIG. 7 during manufacturing the semiconductor package in accordance with some embodiments of the present disclosure. Regarding the semiconductor device 69 with the through-silicon via structure as illustrated in FIG. 2, when packaging such semiconductor devices 69, the space in the via hole 14 is not entirely filled. As shown in FIG. 8, during manufacturing the semiconductor package, a die bonding layer 71 is attached to the RDL 65 and a substrate bonding layer 72 is attached to the second conductive layer (e.g., UBM) 70. The die bonding layer 71 and the substrate bonding layer 72 may include tin (Sn), tin-silver alloy (SnAg), nickel (Ni), gold (Au), copper (Cu), combinations thereof, and the like.

In some embodiments, prior to bonding the semiconductor device 69 to the first substrate 60, the die bonding layer 71 (e.g., including Sn, Ag, Ni, Au, or Cu, or interspersed layers or an alloy thereof, or a combination of the foregoing) is disposed over the RDL 65. The substrate bonding layer 72 (e.g., including Sn, Ag, Ni, Au, or Cu, or interspersed layers or an alloy thereof, or a combination of the foregoing) is disposed over the pads on the upper surface of the first substrate 60. When the semiconductor device 69 is attached to the first substrate 60, the die bonding layer 71 and the substrate bonding layer 72 are bonded together.

The semiconductor package shown in FIG. 7 further includes one or more of the first conductive layers (e.g., conductive interconnection vias 63), extending through the semiconductor device 69 from a bottom surface of the semiconductor device 69 to the active circuitry 62, such that the active circuitry 62 is electrically connected to the pads on the upper surface of the first substrate 60.

The first conductive layer (e.g., interconnection via) 63 is generally cylindrical (e.g., including approximately a circular cross-sectional circumference). In other embodiments, the first conductive layer (e.g., interconnection via) 63 is in a shape other than a generally cylindrical shape, such as including approximately a square, rectangular, or elliptical cross-section circumference, or other shape.

The first conductive layer (e.g., interconnection via) 63 includes a conductive upper portion 631 and a conductive wall portion 632 physically and electrically connected to the conductive upper portion 631. In some embodiments, the conductive wall portion 632 is integrally formed with the conductive upper portion 631, such as formed in a same process stage. In some embodiments, the conductive wall portion 632 is integrally formed with the RDL 65.

The conductive wall portion 632 of the first conductive layer (e.g., interconnection via) 63 defines the space 64 at a core of the first conductive layer (e.g., interconnection via) 63 (e.g., the conductive wall portion 632 including an annular cross-section). In some embodiments, the first conductive layer (e.g., interconnection via) 63 includes an insulator portion disposed in the space 64 defined by the conductive wall portion 632. In some embodiments, the space 64 defined by the conductive wall portion 632 is omitted (e.g., the first conductive layer 63 is a solid structure). When the space 64 is unfilled, a gas in the space 64 after packaging may cause a popcorn effect and the space 64 may weaken the structure of the semiconductor device 69 such that a yield of manufacturing the semiconductor package may be decreased.

In some embodiments, the first conductive layer (e.g., interconnection via) 63 further includes a passivation portion 681 encircling a circumference of the conductive wall portion 632. For some embodiments including the passivation layer 68 disposed on the bottom surface of the semiconductor device 69, the passivation layer 68 may be coupled to the passivation portion 681 of the first conductive layer (e.g., interconnection via) 63. In some embodiments, the passivation layer 68 and the passivation portion 681 of the first conductive layer (e.g., interconnection via) 63 are formed integrally, such as in a same process stage.

Referring again to FIG. 7 and FIG. 8, the first conductive layers (e.g., interconnection vias) 63 are positioned such that each first conductive layer (e.g., interconnection via) 63 contacts a pad on the upper surface of the first substrate 60, and multiple first conductive layers (e.g., interconnection vias) 63 may contact a single pad on the upper surface of the first substrate 60.

Figure 9:
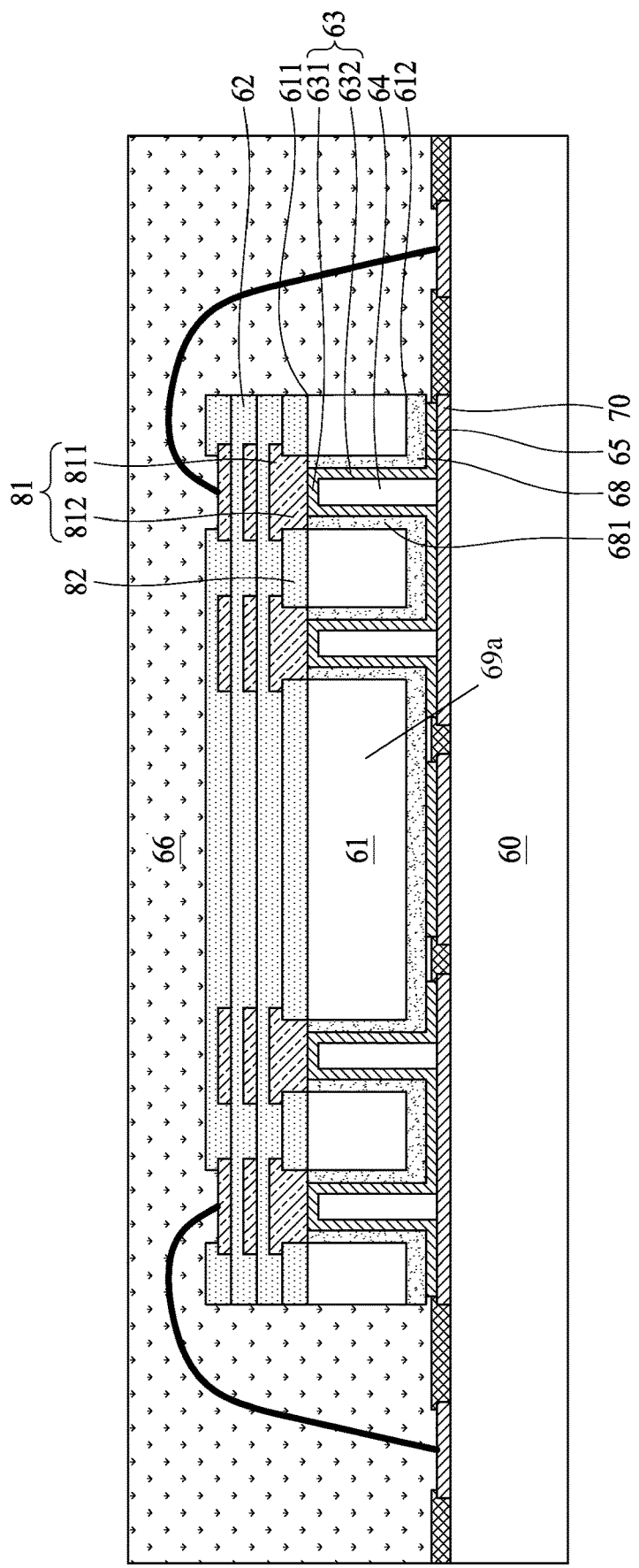
FIG. 9 illustrates a cross-sectional view of a semiconductor package in accordance with some embodiments of the present disclosure.

FIG. 9 illustrates a cross-sectional view of a semiconductor package in accordance with some embodiments of the present disclosure. Referring to FIG. 9, a semiconductor device 69a is similar to the semiconductor device 69 illustrated and described with reference to FIG. 7, except that the active circuitry 62 includes a second conductive layer 81, and the second conductive layer 81 includes a first portion 811 on a first dielectric layer 82 and a second portion 812 surrounded by the first dielectric layer 82. The second portion 812 of the second conductive layer 81 extends from the first portion 811 of the second conductive layer 81 through the first dielectric layer 82 to contact the first surface 611 of the second substrate 61.

In some embodiments, the semiconductor package of FIG. 9 may further includes a seed layer 13 (e.g., as shown in FIG. 1) between the first conductive layer 63 and the second portion 812 of the second conductive layer 81. In some embodiments, the seed layer 13 (e.g., as shown in FIG. 1) contacts the second portion 812 of the second conductive layer 81.

FIG. 9 illustrates an example of a semiconductor package structure according to some embodiments of the present disclosure, shown in a cross-sectional view. The semiconductor package structure of FIG. 9 is similar to the semiconductor package structure of FIG. 7, with a difference being in a structure of an interconnection via.

In FIG. 9, the second conductive layer 81 (e.g., first metal layer of metal interconnect layers in the active circuitry 62 disposed on a top surface of a semiconductor device) includes a planar section 811 and a protruding section 812 connected to the planar section 811, the protruding section 812 extending through the first dielectric layer 82 (of stacked interlayer dielectrics in the active circuitry 62) and connecting to the conductive wall portion 632 of the first conductive layer (e.g., interconnection via) 63.

To prevent a popcorn effect at the first conductive layer 63 caused by the space 64 in the semiconductor package, insulating material can be filled into the space 64. However, filling insulating material into the space 64 may introduce extra costs and processes.

Figure 10:
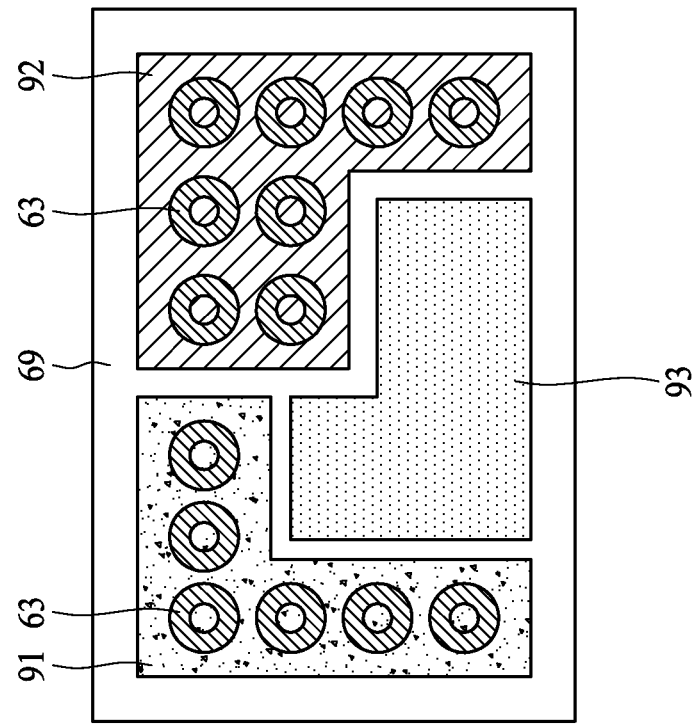
FIG. 10 illustrates a bottom view of a semiconductor device in a semiconductor package and a top view of a substrate in the semiconductor package in accordance with some embodiments of the present disclosure.
Figure 10:
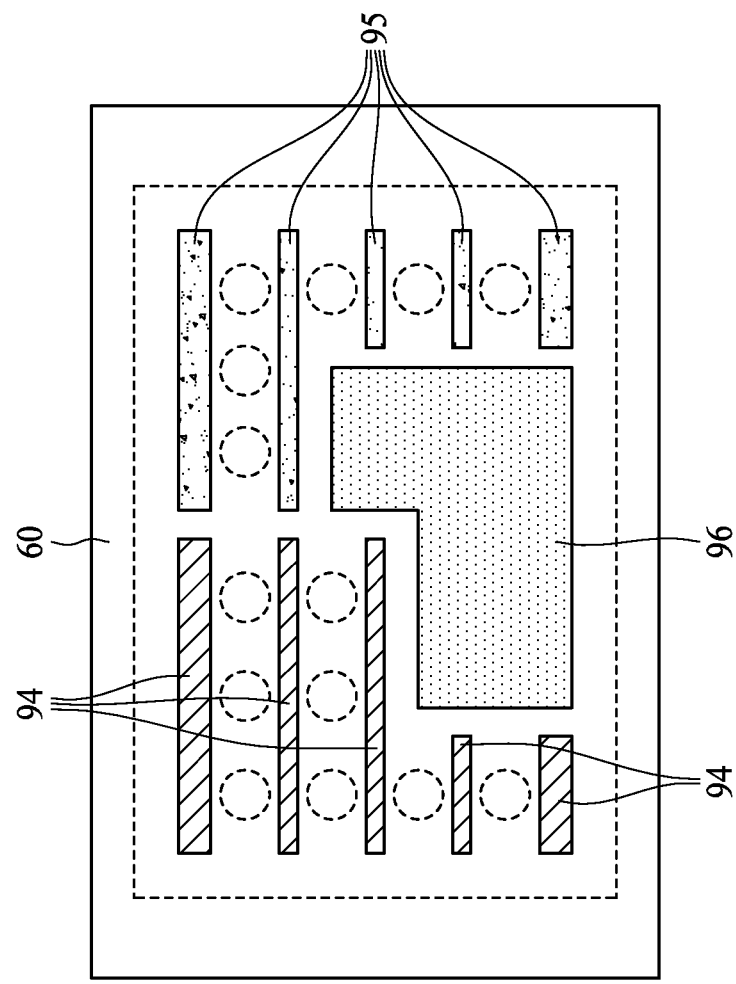

FIG. 10 illustrates a bottom view of the semiconductor device 69 in a semiconductor package and a top view of a substrate in the semiconductor package. The semiconductor package further includes separated pads 94 and 95 disposed on an upper surface of the first substrate 60. In some embodiments, the semiconductor package further includes a dummy net pad 96 electrically connected to an RDL 93.

FIG. 10 illustrates one example of a portion of the semiconductor package of FIG. 7 according to some embodiments of the present disclosure. At the left-hand side in FIG. 10 is depiction of the semiconductor device 69 as viewed facing the bottom surface of the semiconductor device 69 (also showing RDLs 91, 92 and 93 disposed on the bottom surface of the semiconductor device 69). A first group of first conductive layer (e.g., interconnection vias) 63 (e.g., also referred to as through-silicon vias) is shown as being connected by a power plane in the RDL 91, and a second group of interconnection vias 63 is shown as being connected by a ground plane in the RDL 92. At the right-hand side in FIG. 10 is a depiction of the substrate as viewed facing the upper surface of the substrate (also showing the pads and solder mask disposed on the upper surface of the substrate).

As can be seen in FIG. 10, power pads 95 and ground pads 94 on the upper surface of the first substrate 60 correspond to respective power pads 91 and ground pads 92 in the RDL 91, 92 and 93 on the semiconductor device 69.

Also shown in FIG. 10 is the dummy net pad 93 in the RDL 91, 92 and 93 and corresponding dummy net pads 96 on the upper surface of the first substrate 60. The power pad 91, ground pad 92 and dummy net pad 93 in the RDL with corresponding power pads 95, ground pads 94 and dummy pads 96 on the upper surface of the first substrate 60 are shown by way of example, and many other configurations are encompassed by the present disclosure. For example, configurations omitting one or more of the power pad, ground pad and dummy net pad (and corresponding pads) are contemplated. For another example, configurations including I/O planes and corresponding pads are contemplated. For a further example, configurations in which one or more of the interconnection vias are not connected to the RDL are contemplated.

As shown in the right-hand side of FIG. 10, pads 94 and 95 disposed on the upper surface of the first substrate 60 are illustrated as strips, with the encapsulation layer (e.g., mold compound) 66 or underfill filling gaps between the pads. In some embodiments, the strips are protruding portions of a plane; in other embodiments, the strips are not connected as part of a plane, and in some embodiments may be connected within the substrate.

As shown in the right-hand side of FIG. 10, by way of dotted circles, the semiconductor device 69 is positioned on the substrate 60 such that the first conductive layers (e.g., interconnection vias) 63 avoid the pad strips disposed on the upper surface of the substrate, whereas the power and/or ground pads of the RDLs 91, 92 and 93 disposed on the bottom surface of the semiconductor device 69 will contact the pad strips on the upper surface of the substrate. Because the encapsulation layer (e.g., mold compound) 66 or underfill is disposed in the space 64 of the first conductive layer (e.g., interconnection via) 63 and is also disposed between the semiconductor device 69 and the first substrate 60 (e.g., in the spaces between pads), a strength of the interface between the semiconductor device 69 and the first substrate 60 may be improved. Accordingly, a reliability of the semiconductor package structure may be improved.

Since there are gaps between the power pads 95, the encapsulation material of the encapsulation layer 66 may flow into the gaps between the power pads 95 and fill into the space 64 during encapsulation of the semiconductor device 69. Therefore, the encapsulation layer 66 is in the space 64 defined in the semiconductor device 69. Since there are also gaps between the ground pads 94, the encapsulation material of the encapsulation layer 66 may also flow into the gaps between the ground pads 94 and fill into the space 64 during encapsulation of the semiconductor device 69. The molding compound of the encapsulation layer 66 or the underfill fills a space between the separation pads 94 and 95.

As shown in FIG. 10, the gaps between the power pads 95 and the ground pads 94 are wider than the first conductive layer (e.g., interconnection via) 63.

Figure 11:
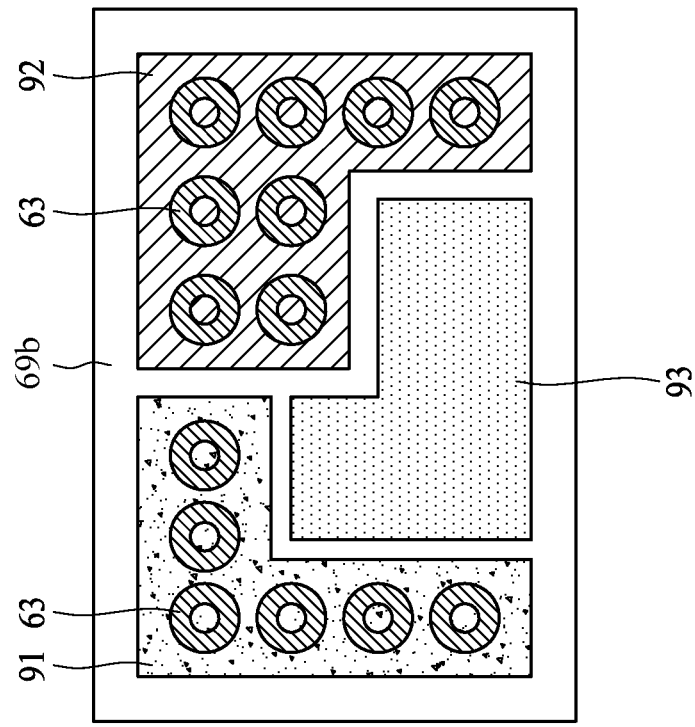
FIG. 11 illustrates a bottom view of a semiconductor device in a semiconductor package and a top view of a substrate in the semiconductor package in accordance with some embodiments of the present disclosure.
Figure 11:
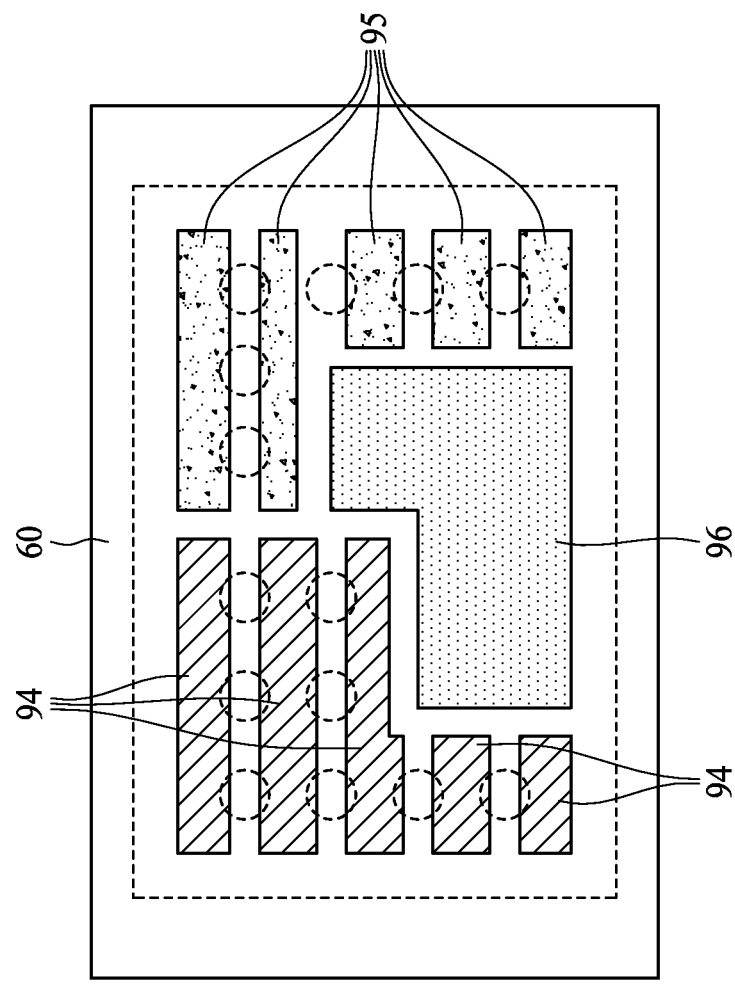

FIG. 11 illustrates a bottom view of a semiconductor device 69b in a semiconductor package and a top view of a substrate in the semiconductor package. Referring to FIG. 11, the semiconductor package is similar to the semiconductor package illustrated and described with reference to FIG. 10, except that the gaps between the power pads 95 and ground pads 94 are narrower than the first conductive layer (e.g., interconnection via) 63. The first conductive layers (e.g., interconnection vias) 63 contact portions of the pad strips 94 or 95, for direct electrical connection between the first conductive layers (e.g., interconnection vias) 63 and the pad strips 94 or 95 on the upper surface of the substrate 60.

Figure 12:
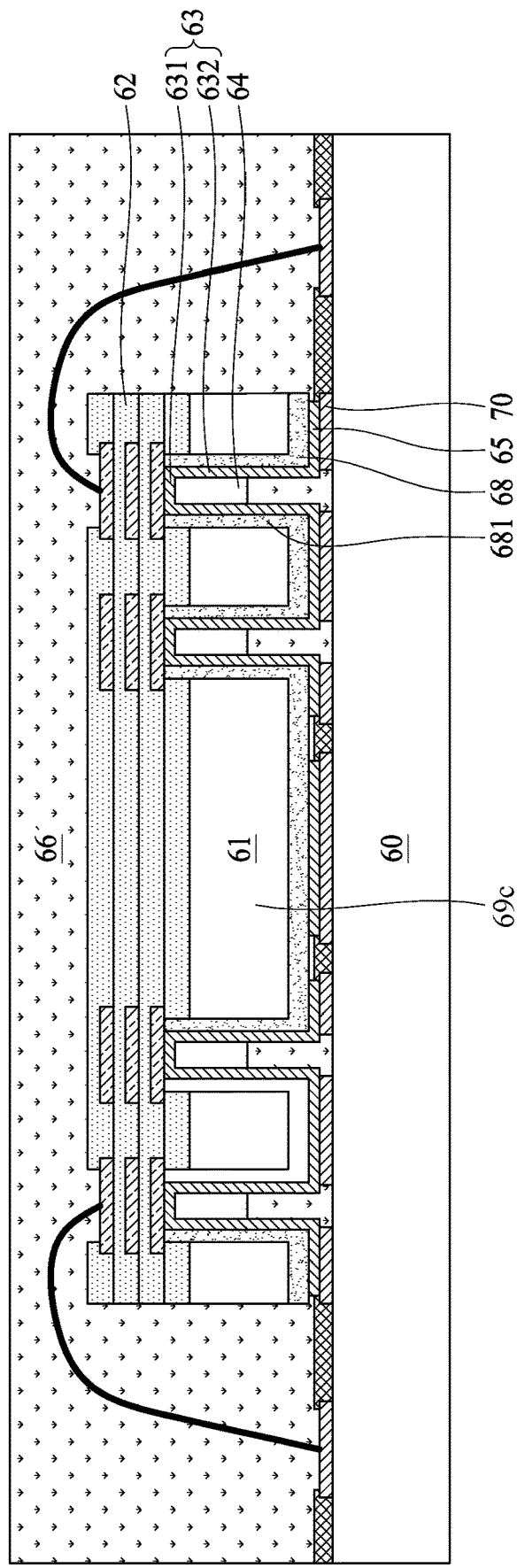
FIG. 12 illustrates a cross-sectional view of a semiconductor package in accordance with some embodiments of the present disclosure.

FIG. 12 illustrates a cross-sectional view of a semiconductor package in accordance with some embodiments of the present disclosure. Referring to FIG. 12, the semiconductor package is similar to the semiconductor package illustrated and described with reference to FIG. 7, except that the encapsulation layer 66 is partially filled into the space 64 defined in a semiconductor device 69c.

Figure 13:
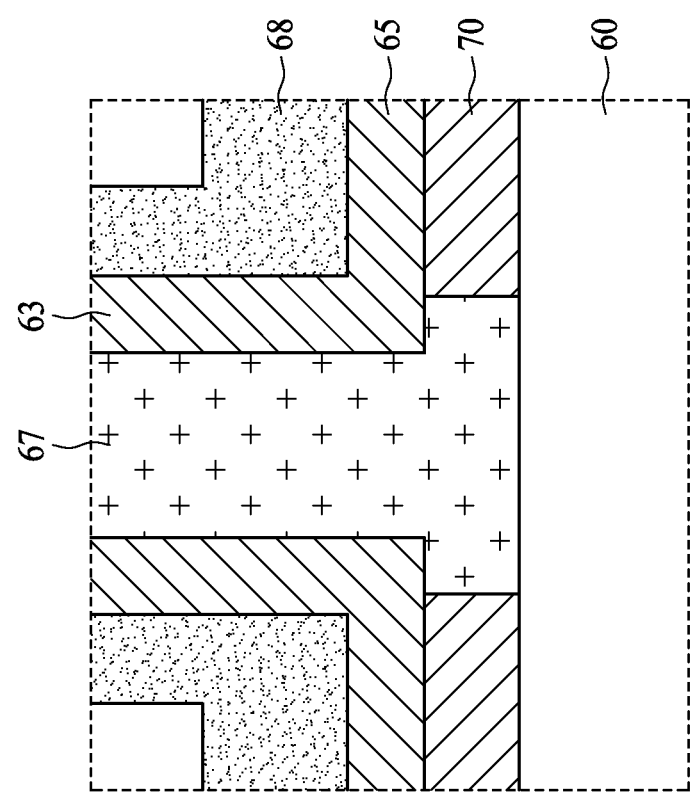
FIG. 13 illustrates an enlarged view of a portion of the semiconductor package shown in FIG. 12 in accordance with some embodiments of the present disclosure.

FIG. 13 illustrates an enlarged view of a portion of the semiconductor package shown in FIG. 12. FIG. 13 shows that the mold compound of the encapsulation layer 66 or underfill fills the interconnection via, and also fills into gaps between the semiconductor device 69c and the first substrate 60.

Figure 14:
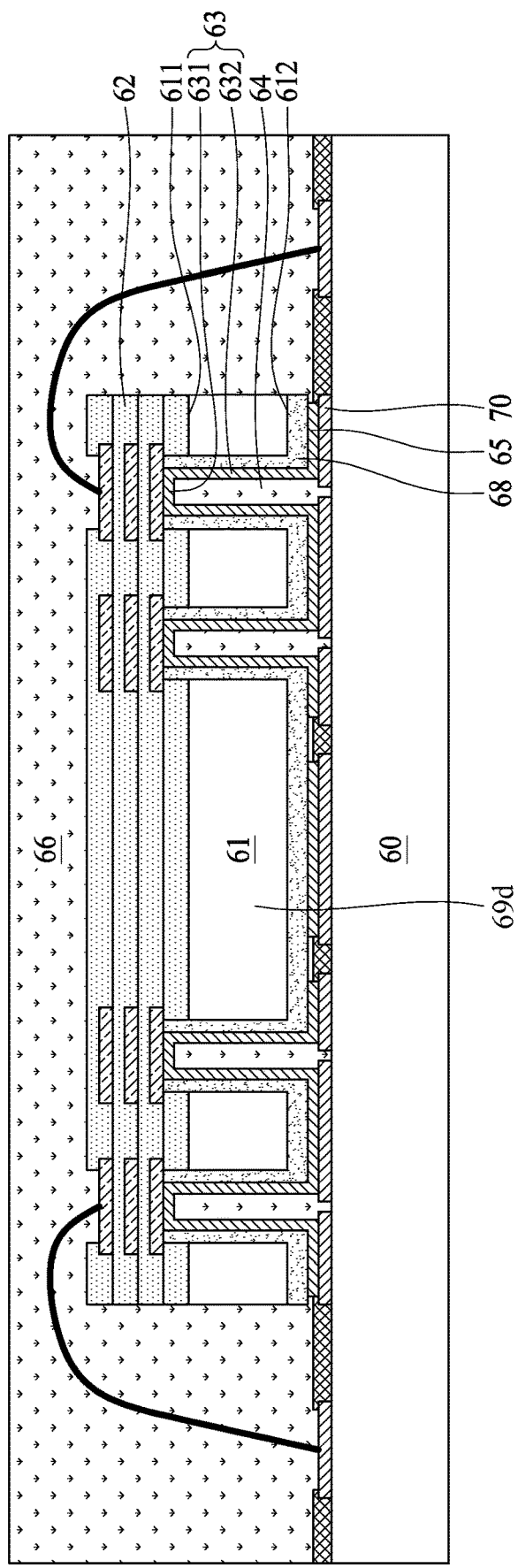
FIG. 14 illustrates a cross-sectional view of a semiconductor package in accordance with some embodiments of the present disclosure.

FIG. 14 illustrates a cross-sectional view of a semiconductor package in accordance with some embodiments of the present disclosure. Referring to FIG. 14, the semiconductor package is similar to the semiconductor package illustrated and described with reference to FIG. 7, except that the encapsulation layer 66 is fully filled into the space 64 defined in a semiconductor device 69d.

Figure 15:
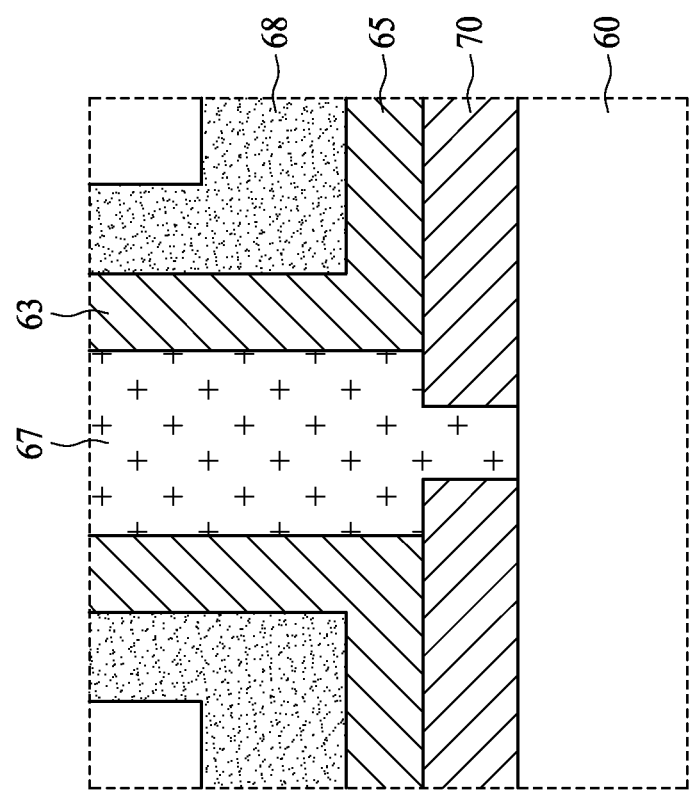
FIG. 15 illustrates an enlarged view of a portion of the semiconductor package shown in FIG. 14 in accordance with some embodiments of the present disclosure.

FIG. 15 illustrates an enlarged view of a portion of the semiconductor package shown in FIG. 14. FIG. 15 shows that the mold compound of the encapsulation layer 66 or underfill fills the interconnection via, and also fills into gaps between the semiconductor device 69d and the first substrate 60.

Figure 16:
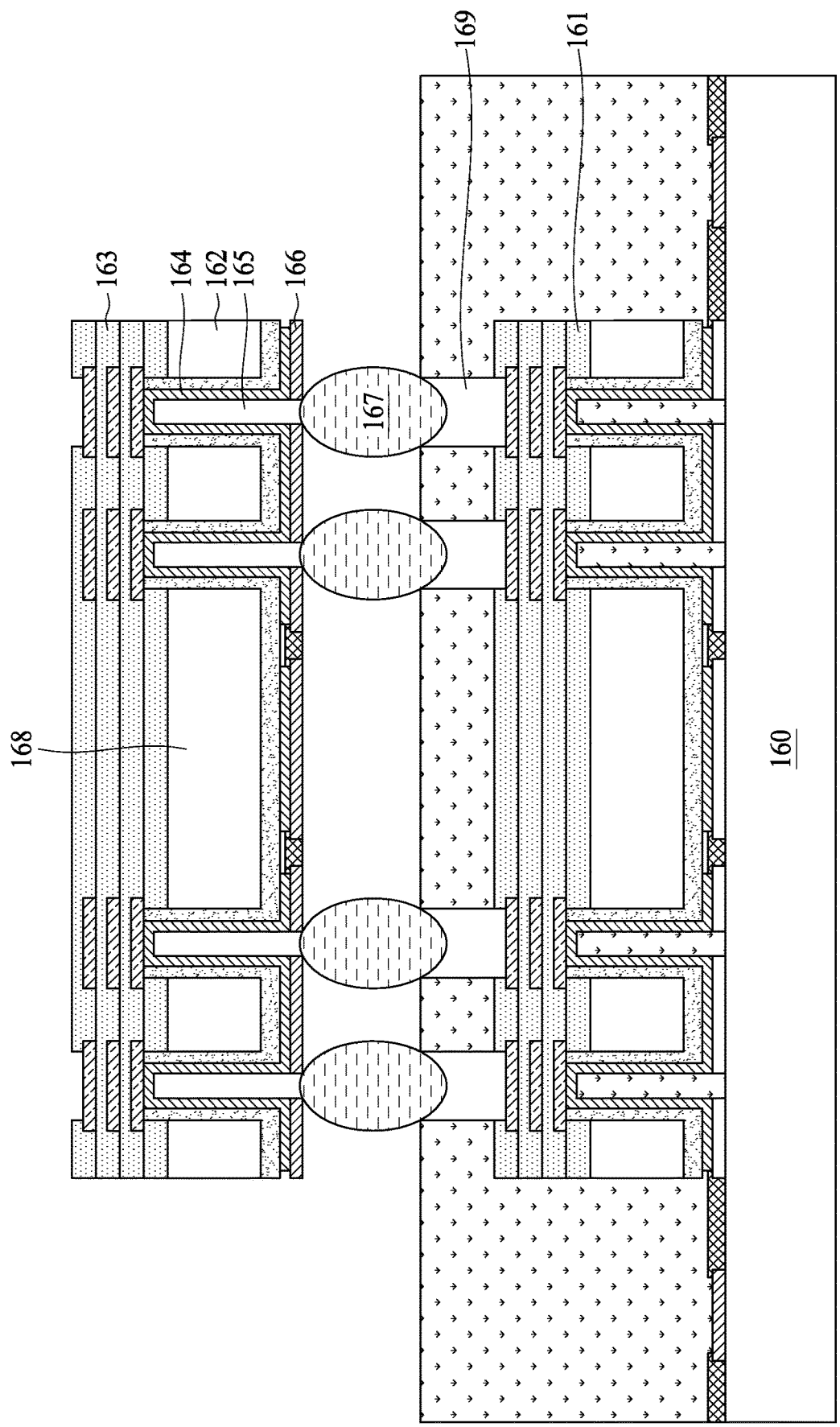
FIG. 16 illustrates a package-on-package structure in accordance with some embodiments of the present disclosure.
Figure 17:
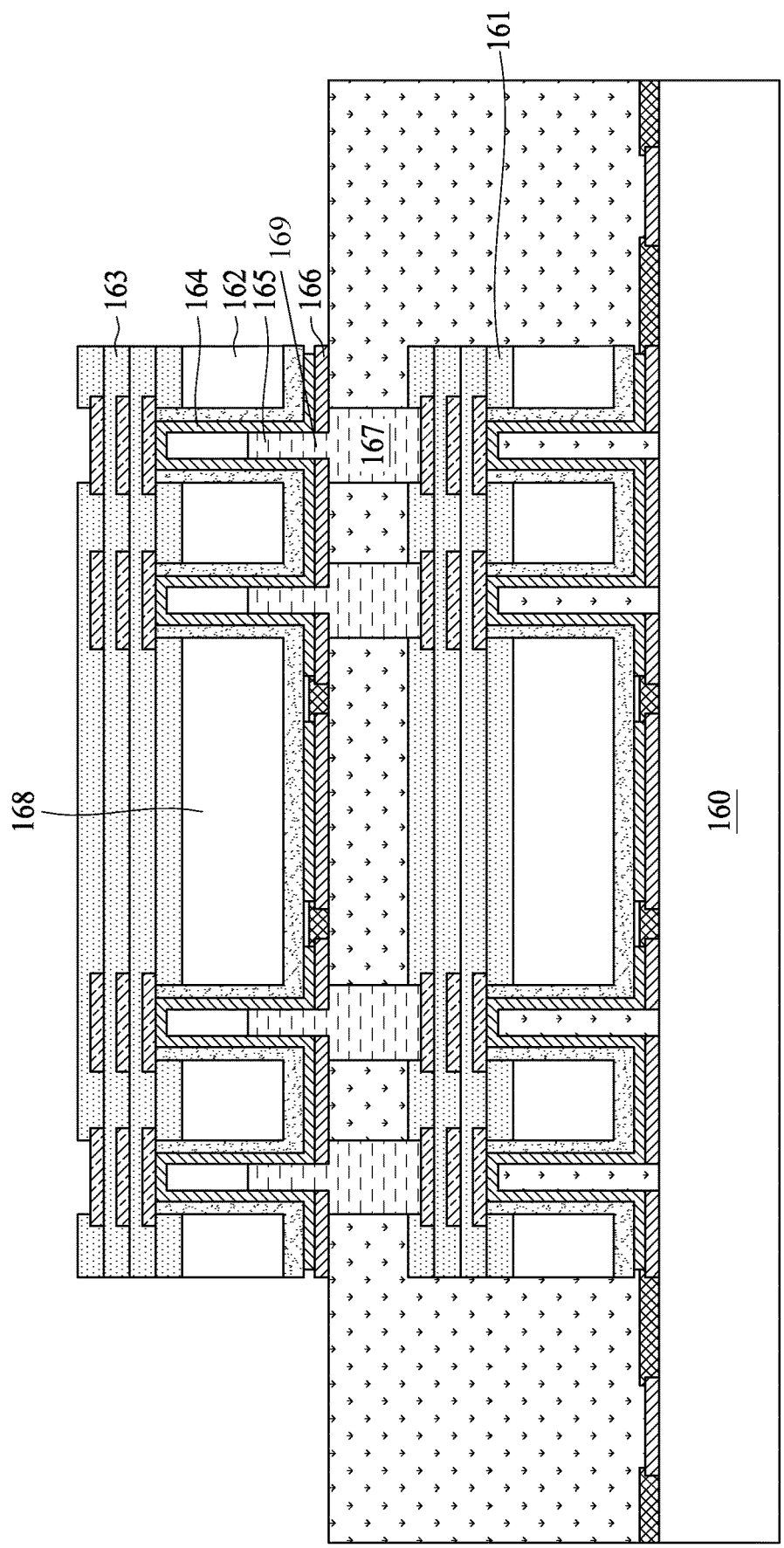
FIG. 17 illustrates a package-on-package structure in accordance with some embodiments of the present disclosure.

FIG. 16 illustrates a package-on-package structure during manufacturing in accordance with some embodiments of the present disclosure. FIG. 17 illustrates a package-on-package structure in accordance with some embodiments of the present disclosure. The package-on-package structure includes a first semiconductor package structure 161, a second semiconductor device 168, an RDL 166 and a solder material 167. The second semiconductor device 168 is disposed over the first semiconductor package structure 161. The second semiconductor device 168 includes active circuitry 163 disposed on a top surface of the second semiconductor device 168. The second semiconductor device 168 further includes at least one via 164 in electrically conductive contact with the active circuitry 163. The RDL 166 is disposed on a bottom surface of the second semiconductor device 168. The at least one via 164 extends between the RDL 166 and the active circuitry 163. The solder material 167 is disposed between the first semiconductor package structure 161 and the RDL 166. In some embodiments, the solder material 167 at least partially fills into a space 165 in the at least one via 164.

In FIG. 17, openings 169 are formed in a top surface of the semiconductor package structure 161, connection components 167 (e.g., solder balls) are disposed in the openings 169, and the semiconductor device 168 is disposed on the connection components 167 such that the interconnection vias 164 of the semiconductor device 168 are electrically connected to interconnection vias of a semiconductor device in the semiconductor package structure 161 by way of the connection components 167.

In some embodiments, a semiconductor package structure includes a substrate, a semiconductor device, active circuitry, a connection pad, a bonding wire, an RDL and at least one interconnection via. The semiconductor device is disposed on a top surface of the substrate. The active circuitry is disposed on a top surface of the semiconductor device. The active circuitry includes a plurality of stacked interlayer dielectrics and a plurality of metal interconnect layers integrated into the interlayer dielectrics in spaced relation to each other. The connection pad is in the active circuitry. The bonding wire connects the connection pad to the substrate. The RDL is disposed on a bottom surface of the semiconductor device. The RDL includes a ground plane and a power plane. The at least one interconnection via extends between the RDL and the active circuitry.

In some embodiments, the interconnection via includes a conductive wall portion. In some embodiments, the conductive wall portion defines a void, further including a mold compound or an underfill at least partially filling the void. In some embodiments, the mold compound or the underfill further fills a space between the semiconductor device and the substrate. In some embodiments, the interconnection via further includes a conductive upper portion connected to the conductive wall portion. In some embodiments, a first metal layer of the metal interconnect layers includes the conductive upper portion of the interconnection via. In some embodiments, the conductive upper portion of the interconnection via is embedded in the top surface of the semiconductor device. In some embodiments, the active circuitry includes a first metal layer of the metal interconnect layers and a first dielectric layer of the stacked interlayer dielectrics. In some embodiments, the first metal layer includes a planar section and a protruding section connected to the planar section. The protruding section extends through the first dielectric layer and connects to the conductive wall portion of the interconnection via.

In some embodiments, the semiconductor package structure further includes pads disposed on an upper surface of the substrate. The pads includes a power pad electrically connected to the power plane of the RDL.

In some embodiments, the semiconductor package structure further includes pads disposed on an upper surface of the substrate. The pads include a ground pad electrically connected to the ground plane of the RDL. In some embodiments, the RDL further includes a dummy net plane or pad.

In some embodiments, the semiconductor package structure further includes pads disposed on an upper surface of the substrate. The pads include a dummy net pad electrically connected to the dummy net plane or pad of the RDL.

In some embodiments, a package-on-package structure includes a semiconductor package structure, a second semiconductor device and connection components. The semiconductor package structure includes a first semiconductor device. The second semiconductor device is disposed over the semiconductor package structure. The connection components electrically connect a top surface of the second semiconductor device to a bottom surface of the first semiconductor device. Each of the first semiconductor device and the second semiconductor device includes active circuitry, an RDL and at least one interconnection via. The active circuitry is on a first surface of the respective semiconductor device. The RDL is disposed on a second surface opposite the first surface, and the RDL includes a ground plane and a power plane. The at least one interconnection via extends between the RDL and the active circuitry.

As used herein, the singular terms "a," "an," and "the" may include plural referents unless the context clearly dictates otherwise.

As used herein, relative terms, such as "inner," "interior," "outer," "exterior," "top," "bottom," "front," "back," "upper," "upwardly," "lower," "downwardly," "vertical," "vertically," "lateral," "laterally," "above," and "below," refer to an orientation of a set of components with respect to one another; this orientation is in accordance with the drawings, but is not required during manufacturing or use.

As used herein, the terms "connect," "connected," and "connection" refer to an operational coupling or linking. Connected components can be directly or indirectly coupled to one another, for example, through another set of components.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one including a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

As used herein, the terms "approximately," "substantially" "substantial," and "about" refer to a considerable degree or extent. When used in conjunction with an event or situation, the terms can refer to instances in which the event or situation occurs precisely as well as instances in which the event or situation occurs to a close approximation, such as when accounting for typical tolerance levels of the manufacturing methods described herein. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

Additionally, amounts, ratios, and other numerical values are sometimes presented herein in a range format. It is understood that such range formats are used for convenience and brevity, and should be interpreted flexibly to include numerical values explicitly specified as limits of a range, as well as all individual numerical values or sub-ranges encompassed within that range, as if each numerical value and sub-range is explicitly specified.

While the present disclosure has been described and illustrated with reference to specific embodiments thereof, these descriptions and illustrations do not limit the present disclosure. It should be understood by those skilled in the art that various changes may be made and equivalents may be substituted without departing from the true spirit and scope of the present disclosure as defined by the appended claims.

The construction and arrangement of the packages and methods as shown in the various example embodiments are illustrative only. Accordingly, all such modifications are intended to be included within the scope of the present disclosure. The order or sequence of any process or method steps may be varied or re-sequenced according to alternative embodiments. Other substitutions, modifications, changes, and omissions may be made in the design, operating conditions and arrangement of the example embodiments without departing from the scope of the present disclosure.

What is claimed is:

1. A semiconductor device, comprising:
 a substrate including a first surface and a second surface opposite the first surface;

a first dielectric layer on the first surface of the substrate;
a first conductive layer on the first surface of the substrate, the first conductive layer comprising a first portion on the first dielectric layer and a second portion surrounded by the first dielectric layer;
a via hole extending from the second surface of the substrate to the first surface of the substrate;
a second conductive layer extending from the second surface of the substrate to the first surface of the substrate through the via hole and electrically connected to the first conductive layer, the second conductive layer defining a space in the via hole; and
a passivation material disposed within the via hole, the passivation material at least partially filling the space defined by the second conductive layer in the via hole,
wherein the second portion of the first conductive layer extends from the first portion of the first conductive layer through the first dielectric layer to contact the first surface of the substrate.

2. The semiconductor device of claim 1, further comprising:
a seed layer between the second conductive layer and the second portion of the first conductive layer.

3. The semiconductor device of claim 2, wherein the seed layer contacts the second portion of the first conductive layer.

4. The semiconductor device of claim 1, wherein a width of the via hole is less than a width of the second portion of the first conductive layer.

5. The semiconductor device of claim 1, further comprising a first passivation layer in the via hole and on the second surface of the substrate, the first passivation layer comprising the passivation material.

6. The semiconductor device of claim 5, further comprising a second passivation layer on the second conductive layer and on the first passivation layer.

7. The semiconductor device of claim 6, wherein a portion of the second passivation layer surrounds the via hole.

8. The semiconductor device of claim 7, wherein a width of the portion of the second passivation layer surrounding the via hole is greater than a width of the second portion of the first conductive layer.

9. The semiconductor device of claim 6, further comprising an RDL disposed at a bottom surface of the first passivation layer, the RDL integrally formed with the second conductive layer.

10. The semiconductor device of claim 1, further comprising a third conductive layer on and electrically connected to the second conductive layer.

11. A semiconductor package, comprising:
a first substrate;
a semiconductor device on the first substrate and comprising:
a second substrate including a first surface and a second surface opposite the first surface;
active circuitry on the first surface of the second substrate;
a first conductive layer extending from the second surface of the second substrate toward the active circuitry and electrically connected to the active circuitry and defining a space in the semiconductor device; and
an encapsulation layer in the space defined in the semiconductor device,
wherein the active circuitry comprises a second conductive layer and a first dielectric layer, wherein the second conductive layer comprises a first portion on the first dielectric layer and a second portion surrounded by the first dielectric layer.

12. The semiconductor package of claim 11, wherein the encapsulation layer is between the semiconductor device and the first substrate.

13. The semiconductor package of claim 11, wherein the second portion of the second conductive layer extends from the first portion of the second conductive layer through the first dielectric layer to contact the first surface of the second substrate.

14. The semiconductor package of claim 13, further comprising a seed layer between the first conductive layer and the second portion of the second conductive layer.

15. The semiconductor package of claim 14, wherein the seed layer contacts the second portion of the second conductive layer.

16. The semiconductor package of claim 11, further comprising separated pads disposed on an upper surface of the first substrate.

17. The semiconductor package of claim 16, wherein the encapsulation layer further fills a space between the separation pads.

18. The semiconductor package of claim 16, further comprising a dummy net pad electrically connected to a redistribution layer (RDL).

19. The semiconductor package of claim 11, further comprising:
another semiconductor device wherein the another semiconductor device comprises active circuitry disposed on a top surface of the another semiconductor device, and wherein the another semiconductor device further comprises:
at least one via hole in electrically conductive contact with the active circuitry;
a redistribution layer disposed on a bottom surface of the another semiconductor device, wherein the at least one via hole extends between the redistribution layer and the active circuitry; and
a solder material, wherein the solder material at least partially fills into a space defined by the at least one via hole.

20. The semiconductor package of claim 11, wherein the encapsulation layer does not completely fill the space defined in the semiconductor device.

21. A semiconductor device, comprising:
a substrate including a first surface and a second surface opposite the first surface;
a via hole extending from the second surface of the substrate to the first surface of the substrate;
a first conductive layer extending from the first surface of the substrate to the second surface of the substrate through the via hole and exposed from the second surface of the substrate;
a second conductive layer adjacent to the second surface of the substrate and contacting the exposed first conductive layer by the second surface of the substrate;
a third conductive layer extending from the second surface of the substrate to the first surface of the substrate and electrically connected to the second conductive layer, the third conductive layer defining a space in the via hole; and
a passivation material disposed within the via hole, the passivation material at least partially filling the space defined by the third conductive layer in the via hole.

22. The semiconductor device of claim 21, further comprising a first dielectric layer, wherein the second conductive layer comprises a first portion on the first dielectric layer and a second portion surrounded by the first dielectric layer.

23. The semiconductor device of claim 21, wherein a width of the via hole is less than a width of the second portion of the second conductive layer.

* * * * *